(12) United States Patent
Lo Hine Tong et al.

(10) Patent No.: US 9,825,350 B2
(45) Date of Patent: Nov. 21, 2017

(54) ASSEMBLY OF CIRCUIT BOARDS AND ELECTRONIC DEVICE COMPRISING SAID ASSEMBLY

(71) Applicant: THOMSON LICENSING, Issy les Moulineaux (FR)

(72) Inventors: Dominique Lo Hine Tong, Rennes (FR); Philippe Minard, Saint Medard sur Ille (FR); Jean-Marc Le Foulgoc, Bourgbarre (FR)

(73) Assignee: THOMSON LICENSING, Issy les Moulineaux (FR)

( * ) Notice: Subject to any disclaimer, the term of this patent is extended or adjusted under 35 U.S.C. 154(b) by 56 days.

(21) Appl. No.: 14/963,162

(22) Filed: Dec. 8, 2015

(65) Prior Publication Data

US 2016/0233571 A1 Aug. 11, 2016

(30) Foreign Application Priority Data

Dec. 8, 2014 (EP) .................................... 14306973

(51) Int. Cl.
*H01Q 1/24* (2006.01)
*H01Q 1/22* (2006.01)
(Continued)

(52) U.S. Cl.
CPC .......... *H01Q 1/2283* (2013.01); *H01Q 1/243* (2013.01); *H01Q 1/38* (2013.01); *H01Q 1/48* (2013.01); *H01Q 9/0421* (2013.01); *H01Q 9/42* (2013.01); *H05K 1/144* (2013.01); *H05K 1/0243* (2013.01); *H05K 1/0253* (2013.01); *H05K 2201/042* (2013.01); *H05K 2201/09727* (2013.01); *H05K 2201/10098* (2013.01)

(58) Field of Classification Search
CPC ........ H01Q 1/2283; H01Q 1/243; H01Q 1/48; H01Q 9/0421; H01Q 9/42
See application file for complete search history.

(56) References Cited

U.S. PATENT DOCUMENTS 7,042,404 B2    5/2006  Jo et al.
7,468,701 B2   12/2008  Fujikawa et al.
(Continued)

OTHER PUBLICATIONS

Zhang et al "High transmission gain inverted-F antenna on low-resistivity Si for wireless interconnect"; IEEE Electron Device Letters, vol. 27, No. 5; pp. 374-376; Journal Paper English.
(Continued)

*Primary Examiner* — Hoang Nguyen
(74) *Attorney, Agent, or Firm* — Brian J. Dorini; Patricia A. Verlangieri

(57) ABSTRACT

A circuit board assembly for an electronic device, comprising: a main circuit board provided with a ground plane and at least one electronic component for performing one or more functions of the electronic device; a wireless module board spaced apart from and over the main circuit board, the wireless module board being provided with a feed line and at least one wireless module for performing wireless operations; and an antenna element for wireless communication, the antenna element comprising a resonating element, a first connection element connected to the feed line of the wireless module board and a second connection element connected to the main circuit board.

14 Claims, 5 Drawing Sheets

(51) Int. Cl.
*H01Q 1/38* (2006.01)
*H01Q 9/04* (2006.01)
*H01Q 9/42* (2006.01)
*H05K 1/14* (2006.01)
*H01Q 1/48* (2006.01)
*H05K 1/02* (2006.01)

(56) References Cited

U.S. PATENT DOCUMENTS

| | | | |
|---|---|---|---|
| 7,969,365 B2 * | 6/2011 | Asraff | H01Q 1/243 |
| | | | 343/702 |
| 2005/0110693 A1 | 5/2005 | Ryu | |
| 2006/0273980 A1 | 12/2006 | Chan | |
| 2009/0023398 A1 | 1/2009 | Boyle | |
| 2010/0149041 A1 | 6/2010 | Asraff et al. | |
| 2012/0062429 A1 | 3/2012 | Uno et al. | |
| 2012/0287010 A1 | 11/2012 | Soekawa | |

OTHER PUBLICATIONS

Kikkawa et al "Analysis of silicon on-chip integrated antennas for intra- and inter-chip wireless interconnects" ESSDERC 2010—40th European Solid State Device Research Conference Conference Paper English; pp. 114-117.

Yordanov et al "Chip-to-chip interconnects using integrated antennas"; 2008 38th European Microwave Conference Conference Paper English; pp. 777-780.

Ali etal "Planar Array Antenna With Parasitic Elements for Beam Steering Control"; Progress in Electromagnetics Research Sympsosium Proceedings, Aug. 18-21, 2009; pp. 181-185.

IEEE Std 802.11b; 1999 (R2003), Part 11, pp. 1-96.

IEEE 802.11a; 1999, ANSI-IEEE; Part 11, pp. 1-90.

IEEE Std 802.11n TM; 2009, Part 11, pp. 1-536.

Search Report dated June 9, 2015.

* cited by examiner

ASSEMBLY OF CIRCUIT BOARDS AND ELECTRONIC DEVICE COMPRISING SAID ASSEMBLY

This application claims the benefit, under 35 U.S.C. § 119 of European Patent Application No. 14306973.0, filed Dec. 8, 2014.

TECHNICAL FIELD

The present invention relates to an assembly of circuit boards and a wireless electronic device comprising said assembly of circuit boards.

BACKGROUND

Electronic wireless devices such as mobile telephones, tablets, set-top boxes and gateway devices are provided with at least one antenna and corresponding wireless functional components for processing signals received from and/or transmitted via the antenna.

A wireless module including wireless functional components for wireless applications may be integrated into an electronic device in several ways. In some cases wireless functional components are provided directly on the main circuit board, while in other cases wireless functional components are provided on a separate circuit board. Interconnection elements are provided to enable the transition of radio frequency signals between the two circuit boards. Providing the wireless functional components on a separate board has the advantage that any modifications or repairs to the wireless operation of the electronic device do not necessitate modification of the main circuit board. However, insertion losses may occur at the interconnection.

Another problem encountered in electronic wireless devices is the presence of an increasing number of electronic components in an increasingly reduced space. An antenna is an important functional element of such wireless devices for effective transmission and reception of radio frequency waves. The optimum place for positioning an antenna is at the front of the wireless device. However the presence of the many other electronic components at the front of a wireless device creates obstacles to the radiation of radio waves and impairs the performance of the antenna. Moreover in some configurations large areas of ground clearance need to be provided on the circuit board to provide appropriate grounding of the antenna. Because of the presence of the other electronic components it is becoming increasingly difficult to find the required space for ground clearance of antennas at the front side of the circuit board.

The present invention has been devised with the foregoing in mind.

SUMMARY

According to a first aspect of the invention there is provided a circuit board assembly for an electronic device, comprising: a main circuit board provided with a ground plane and at least one electronic component for performing one or more functions of the electronic device; a wireless module board spaced apart from and over the main circuit board, the wireless module board being provided with a feed line and at least one wireless module for performing wireless operations; and an antenna element for wireless communication, the antenna element comprising a resonating element, a first connection element connected to the feed line of the wireless module board and a second connection element connected to the main circuit board.

In an embodiment, the second connection element is connected to the ground plane of the main circuit board.

In an embodiment, the antenna element comprises an Inverted F type antenna.

In an embodiment, the antenna element comprises a monopole antenna.

In an embodiment, the feed line is connected to an output of the wireless module.

In an embodiment, the antenna element is disposed at an edge of the main circuit board to face outwards from the circuit board.

In an embodiment, the resonating element is positioned over the ground plane of the main circuit board In an embodiment, the input impedance of the antenna is matched by adjustment of the width of parts composing the antenna element.

In an embodiment, the first connection element is disposed perpendicularly to the second connection element, the first connection element and the second connection element being disposed perpendicularly to the resonating element of the antenna.

In an embodiment, the resonating element is arranged over and parallel to the main board, extending along a side of the wireless module board, the first connection element extends from a side of the resonating element towards the wireless module board and the second connection element extends from the resonating element towards the main board.

In an embodiment, the resonating element comprises a first part and a second part extending perpendicularly to the first part, the first and second part being arranged to border a corner of the wireless module board.

In an embodiment, a ground clearance area is provided on the main board in registration with the first and second part of the resonating element.

In an embodiment, the resonating element of the antenna is formed in an L shape, comprising a first part extending along a side of the wireless module board and a second part arranged to extend away from the main circuit board.

In an embodiment, the second connection element is connected to the main board via a grounding connection of the wireless module board In an embodiment, the second connection element extends from the resonant element to the wireless module board and is arranged parallel to the first connection element.

In an embodiment, the resonating element comprises a first part extending along a first side of the wireless module board and a second part extending perpendicularly to the first part, along a second adjacent side of the wireless module board.

The wireless module may for example be a WiFi module, an LTE module, a DECT module or a ZigBee module.

In an embodiment, the circuit board assembly comprises a plurality of antenna elements. At least one coupling element may be provided for interconnecting two antenna elements.

In an embodiment, a first antenna element of the plurality of antenna elements comprises a first part extending along a first side of the wireless module board and a second part extending perpendicularly to the first part, along a second adjacent side of the wireless module board and the second antenna element of the plurality of antenna elements comprises A second aspect of the invention provides a MIMO device comprising a circuit board assembly according to any embodiment of the first aspect of the invention, the circuit board assembly being provided with a plurality of antenna elements.

A third aspect of the invention provides an antenna for wireless applications the antenna being configured to interconnect a wireless module board to a main circuit board, the antenna element comprising a resonating element, a first connection element connected to a feed line of the wireless module board and a second connection element connected to the main circuit board.

In an embodiment, the second connection element is connected to the ground plane of the main circuit board.

A fourth aspect of the invention provides a MIMO device comprising a plurality of antennae according to the third aspect of the invention.

Another aspect of the invention provides an electronic device comprising a circuit board assembly in accordance with any embodiment of the first aspect of the invention. The electronic device may be a gateway or a set-top box.

BRIEF DESCRIPTION OF THE DRAWINGS

Embodiments of the invention will now be described, by way of example only, and with reference to the following drawings in which.

DETAILED DESCRIPTION

Figure 1:
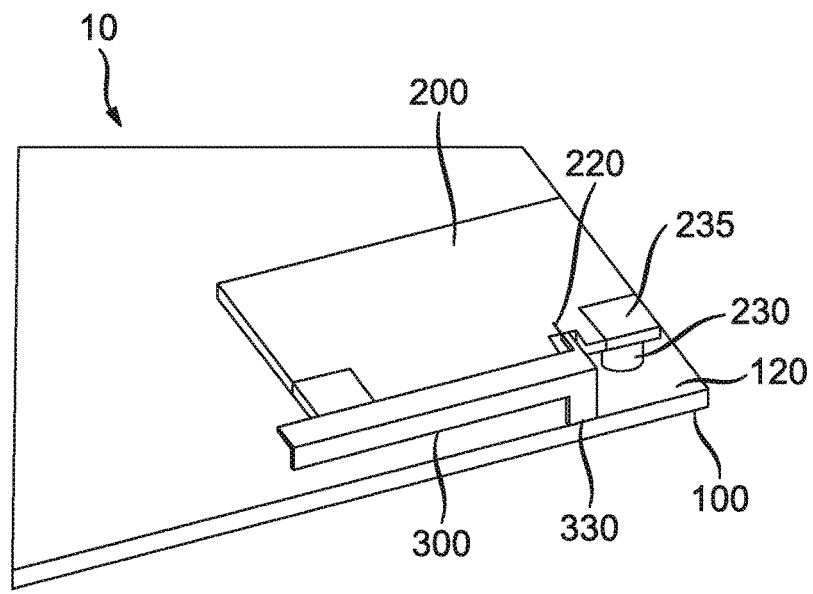
FIG. 1 is a perspective view of an assembly of circuit boards for a wireless electronic device in accordance with a first embodiment of the invention.

FIG. 1 is a perspective view of an assembly of circuit boards for a wireless electronic device in accordance with a first embodiment of the invention. The assembly of circuit boards 10 comprises a main printed circuit board (PCB) 100, typically referred to as a mother board, an additional printed circuit board 200, separate to the main PCB 100 and an antenna element 300. The antenna element 300 is located at the edge of the main PCB for optimum radiation behavior.

The main PCB 100 is provided with electronic components (not shown) for functional operations of the electronic device and a ground plane 120. The additional PCB 200 is provided with a wireless module (not shown) including one or more electronic components for wireless operations of the electronic device and a feeding line 220 connected to the wireless module. Such electronic components for wireless operations of the electronic device include transceiver circuitry for processing RF signals transmitted by or received at the wireless electronic device 10.

The additional circuit board 200 is placed over and spaced apart from the main board 100, and is disposed at an edge of the main PCB 100 close to the antenna element 300 so as not to impair antenna behavior in terms of radiation pattern and impedance matching. In some embodiments of the invention the additional PCB 200 is provided with a ground pad 235 printed on the additional PCB 200 and a fixing pillar 230 extending from the ground pad towards the main PCB 100 for connection to the ground plane 120 of the main PCB 100.

Figure 2A:
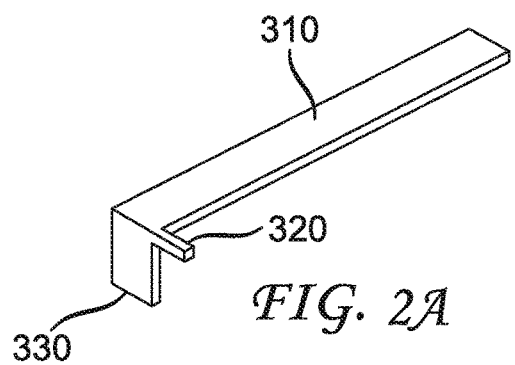
FIGS. 2A and 2B are perspective views of an antenna in accordance with the first embodiment of the invention.
Figure 2B:
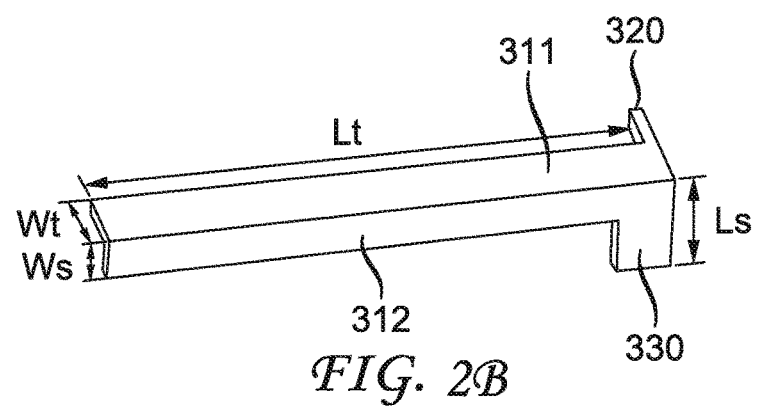

With reference to FIG. 2, the antenna element 300 is an inverted F type antenna (IFA) and comprises a resonating part 310, a feeding pin 320 and a ground pin 330 orientated perpendicularly to one another. The antenna element 300 is arranged on the assembly of circuit boards such that the resonating part 310 is disposed over the main PCB, extending parallel to the main PCB and along an edge of the additional PCB 200. The resonating part 310 comprises a first planar resonating strip 311 extending in a plane parallel to the main PCB 100 and a second resonating strip 312 extending in a plane perpendicular to the first resonating strip at the edge of the main PCB board 100. The grounding pin 330 extends from an end 315 of the resonating part 310, in the same plane as and from the second resonating strip 312 to the main PCB 100 and is connected to the ground plane 120 of the main PCB 100. The feeding pin 320 extends, perpendicularly to the grounding pin 330, from the same end 315 of the resonating strip 310 towards the additional PCB 200 and is connected to the feeding line 220 of the additional PCB. The feeding pin 320 extends in the same plane as and from the first resonating strip 311 towards the additional PCB 200.

The input impedance of the antenna element 300 may be adjusted by optimizing the widths of the different parts, for example to match the input impedance to 50 ohm.

In one application the antenna may be designed to operate in the 2.4-2.5 GHz frequency band. An example of the dimensions of the antenna element for such a waveband are as follows: the length of the resonating part 310 is 25.7 mm, the width of the first resonating strip 311 is 3.2 mm, the width of the second resonating strip 312 is 2 mm, the full length of the grounding pin is 5.6 mm and the thickness of the resonating strips and the ground pin is 0.6 mm. Such a configuration has demonstrated return losses of less than −10 dB, peak gain and directivity of around 4 dBi, and antenna and radiation efficiencies close to 90% with dominant radiation from the front side of the board assembly 10.

In some embodiments of the invention the grounding pin is formed in an S-shape to extend its length and thereby optimize the return loss response.

Figure 3:
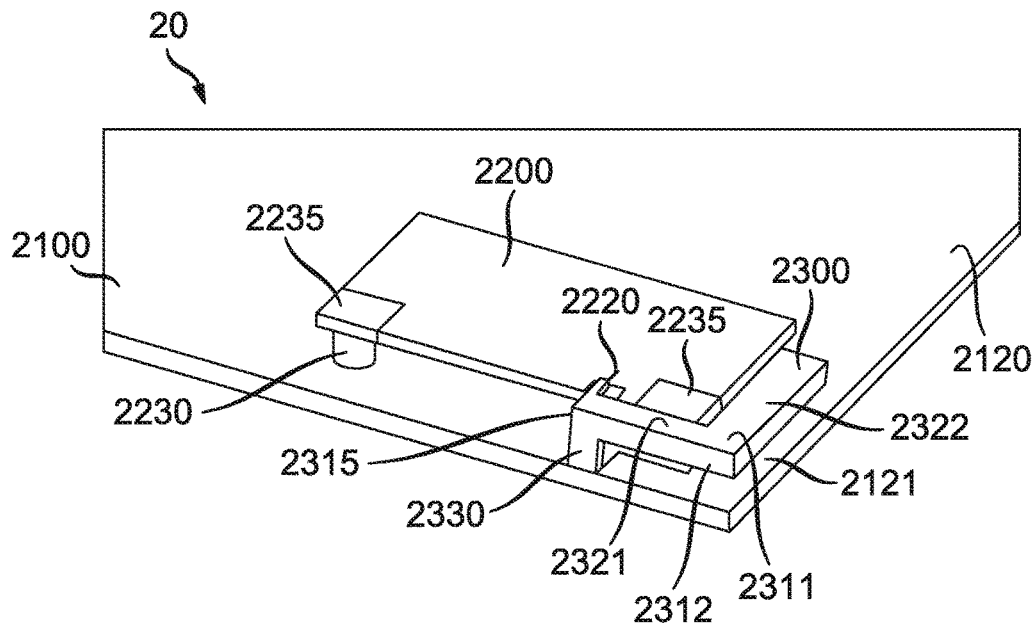
FIG. 3 is a perspective view of an assembly of circuit boards for a wireless electronic device in accordance with a second embodiment of the invention.

FIG. 3 is a perspective view of an assembly of circuit boards for a wireless electronic device in accordance with a second embodiment of the invention. The assembly of circuit boards 20 comprises a main PCB 2100, an additional printed circuit board 2200, separate to the main PCB 2100 and an antenna element 2300 located at an edge of the main circuit board 2100.

As in the first embodiment, the main PCB 2100 is provided with electronic components for functional operations of the electronic device and a ground plane 2120. The additional PCB 2200 is provided with a wireless module including one or more electronic components for wireless operations of the electronic device and a feeding line 2220 connected to the wireless module. The additional circuit board 2200 is placed over and spaced apart from the main PCB 2100, and is disposed at an edge of the main PCB 2100 so as not to impair antenna behavior in terms of radiation pattern and impedance matching. The additional PCB 2200 may be provided with a ground pad printed on the additional PCB 2200 and a fixing pillar extending from the ground pad towards the main PCB 2100 for connection to the ground plane 2120 of the main PCB 2100.

The antenna element 2300 is an inverted F type antenna and comprises a resonating part 2310, a feeding pin 2320 and a ground pin 2330. The antenna element 2300 is arranged on the assembly of circuit boards 20 such that the resonating part 2310 is disposed over the main PCB 2100. The resonating part 2310 is formed in an L shape comprising a first section 2321 extending parallel to the main PCB and along one side edge of the additional PCB 2200 and a second part 2322 orientated perpendicularly to the first part 2321, extending parallel to the main PCB, and arranged to extend along a second side edge of the additional PCB 2200 perpendicular to the first side edge. As in the first embodiment, the resonating part 2310 comprises first and second planar resonating strips 2311 and 2312 orientated perpendicular to one another. The first planar resonating strip 2311 extends in a plane parallel to the main PCB 2100 and the second resonating strip 2312 extends in a plane perpendicular to the first resonating strip 2311 along two perpendicular adjoining edges of the main PCB board 2100. The grounding pin 2330 extends from an end 2315 of the first section 2321 of the resonating part 2310, in the same plane as and from the second resonating strip 2312 to the main PCB 2110 and is connected to the ground plane 2120 of the main PCB 2100. The feeding pin 2320 extends from the same end 2315 of the first section 2321 of the resonating part 2310 towards the additional PCB 2200 and is connected to the feeding line 2220 of the additional PCB. The feeding pin 2320 extends in the same plane as and from a first section of the first resonating strip 2311 towards the additional PCB 2200.

Ground clearance is provided on the main PCB to improve impedance matching. The ground clearance area 2121 in the ground plane 2120 is provided as a demetallized zone in the form of an L shape in registration with the first and second sections 2321, 2322 of the resonating part 2310 of the antenna element 2300. In this embodiment the radiation is directed from a corner of the circuit board assembly 20.

Figure 4A:
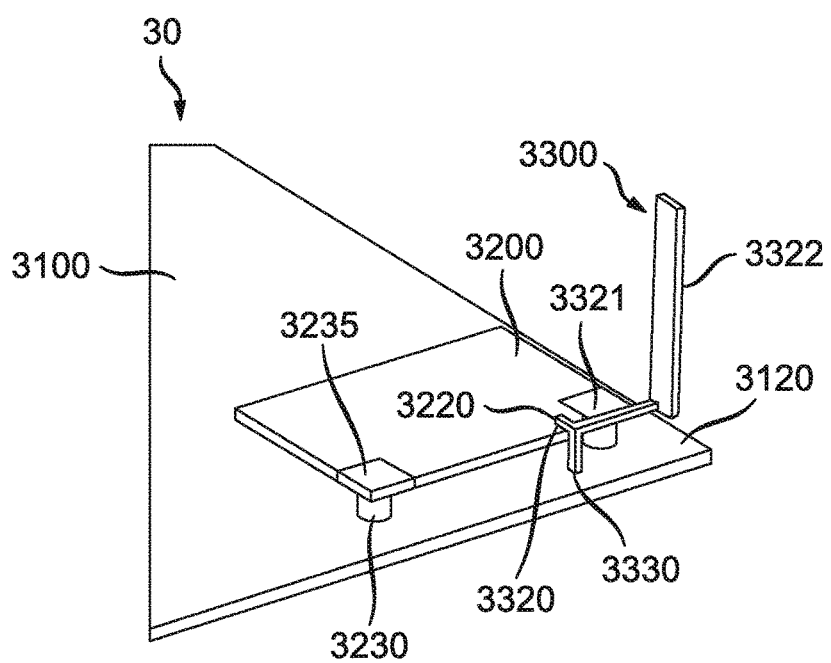
FIG. 4A is a perspective view of an assembly of circuit boards for a wireless electronic device in accordance with a third embodiment of the invention.

FIG. 4A is a perspective view of an assembly of circuit boards 30 for a wireless electronic device in accordance with a third embodiment of the invention. The assembly of circuit boards 30 comprises a main PCB 3100, an additional printed circuit board 3200, separate to the main PCB 3100 and an antenna element 3300.

As in the first and second embodiments, the main PCB 3100 is provided with electronic components for functional operations of the electronic device and a ground plane 3120. The additional PCB 3200 is provided with a wireless module including one or more electronic components for wireless operations of the electronic device and a feeding line 3220 connected to the wireless module. The additional circuit board 3200 is placed over and spaced apart from the main PCB 3100, and is disposed at an edge of the main PCB 3100. The additional PCB 3200 may be provided with a plurality of ground pads 3235 printed on the additional PCB 3200 and corresponding fixing pillars 3230 extending from the respective ground pads 3235 towards the main PCB 3100 for connection to the ground plane 3120 of the main PCB 3100.

The antenna element 3300 is an inverted F type antenna formed in an L shape. The antenna element 3300 comprises a resonating part 3310 formed in an L shape, a feeding pin 3320 and a ground pin 3330. The antenna element 3300 is arranged on the assembly of circuit boards such that the resonating part 3310 extends in a direction away from the main PCB 3100. The resonating part 3310 is formed in an L shape comprising a first section 3321 extending parallel to the main PCB 3100 and along one side edge of the additional PCB 3200 and a second part 3322 extending away from the main PCB 3100, at an edge of the main PCB 3100. The grounding pin 3330 extends from an inner end 3315 of the resonating part 3310, to the main PCB 3100 and is connected to the ground plane 3120 of the main PCB 3100. The feeding pin 3320 extends from the same end 3315 of the resonating strip 3312 towards the additional PCB 3200 and is connected to the feeding line 3220 of the additional PCB 3200. The feeding pin 3320 extends in the same plane as and from the first section of the first resonating strip 3311 towards the additional PCB 3200. This configuration of the antenna element is useful for certain space or radiation pattern constraints or requirements.

Figure 4B:
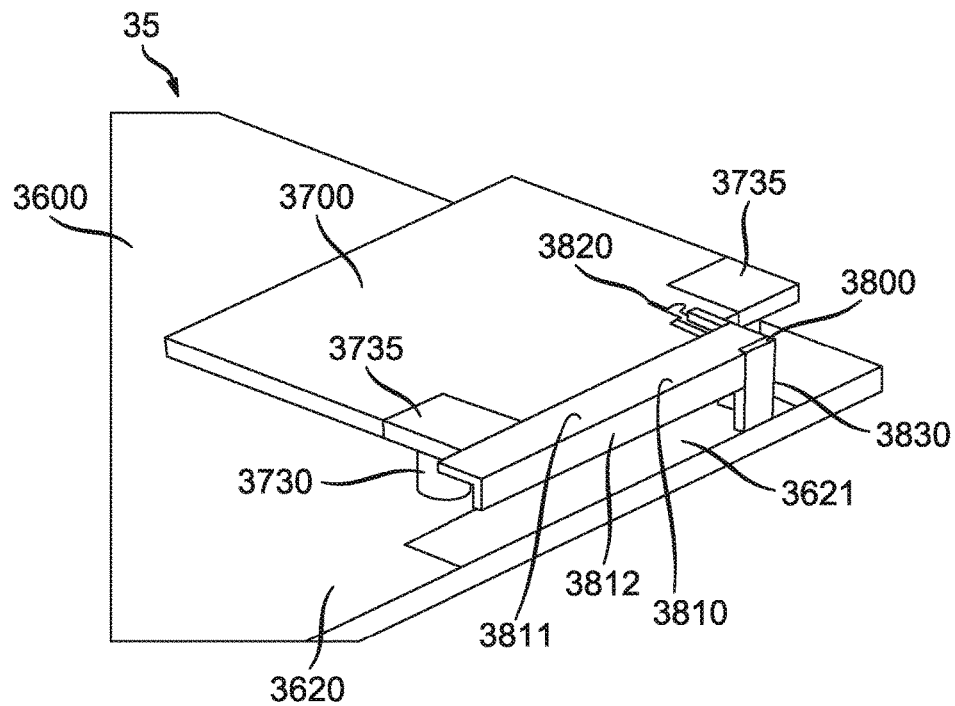
FIG. 4B is a perspective view of an assembly of circuit boards for a wireless electronic device in accordance with a fourth embodiment of the invention.

FIG. 4B is a perspective view of an assembly of circuit boards for a wireless electronic device in accordance with a fourth embodiment of the invention. The assembly of circuit boards 35 comprises a main printed circuit board (PCB) 3600, an additional printed circuit board 3700, separate to the main PCB 3600 and an antenna element 3800. The antenna element 3800 is located at the edge of the main PCB 3600.

The main PCB 3600 is provided with electronic components (not shown) for functional operations of the electronic device, a ground plane 3620 and a ground clearance zone 3621 in the ground plane provided as a demetallized zone located below the resonating part 3810 of the antenna element 3800. The additional PCB 3700 is provided with a wireless module (not shown) including one or more electronic components for wireless operations of the electronic device and a feeding line 3820 connected to the wireless module. Such electronic components for wireless operations of the electronic device include transceiver circuitry for processing RF signals transmitted by or received at the wireless electronic device.

The additional circuit board 3700 is placed over and spaced apart from the main board 3600, and is disposed at an edge of the main PCB 3600 close to the antenna element 3800 so as not to impair antenna behavior in terms of radiation pattern and impedance matching. In some embodiments of the invention the additional PCB 3700 is provided with a ground pad 3735 printed on the additional PCB 3700 and a fixing pillar 3730 extending from the ground pad towards the main PCB 3600 for connection to the ground plane 3620 of the main PCB 3600.

The resonating part 3810 of the antenna element 3800 comprises a first planar resonating strip 3811 extending in a plane parallel to the main PCB 3600 and a second resonating strip 3812 extending in a plane perpendicular to the first resonating strip at the edge of the main PCB board 3600. The vertical pin 3830 extends from an end 3815 of the resonating part 310, in the same plane as and from the second resonating strip 3812 to the main PCB 110 and is fixed to the main PCB 3600 at the ground clearance zone 3621 such that it is not connected to the ground plane 3620. This vertical pin 3830 can be fixed onto the main board with help of metallic pads (not shown) etched on the main board 3600.

Figure 5A:
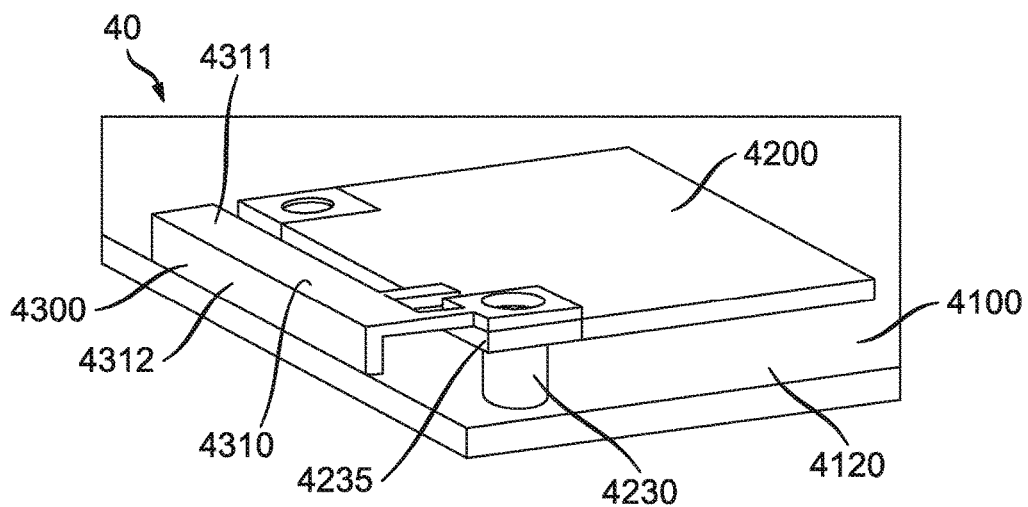
FIGS. 5A and 5B are perspective views of an assembly of circuit boards for a wireless electronic device in accordance with a fifth embodiment of the invention.
Figure 5B:
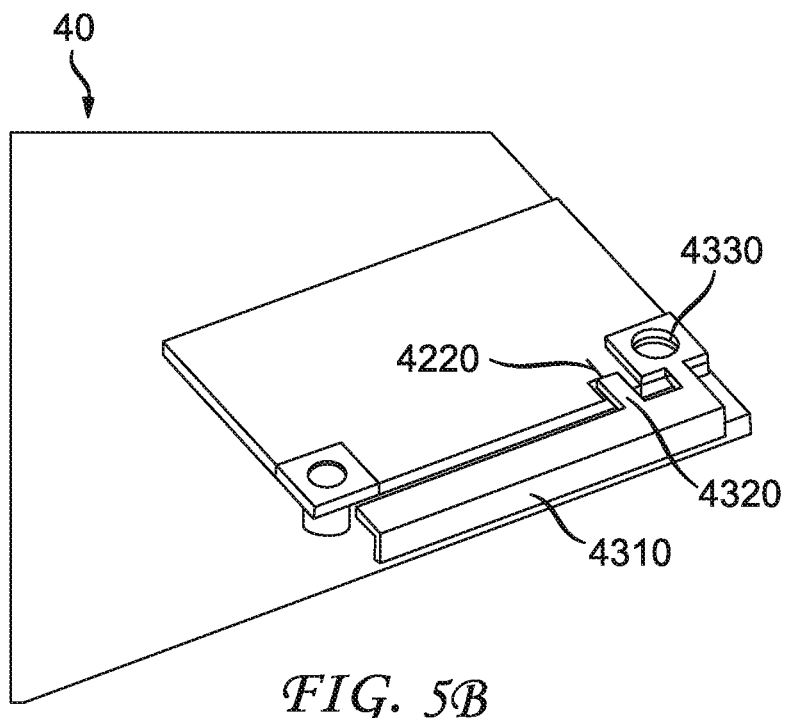

FIGS. 5A and 5B are perspective view of an assembly of circuit boards for a wireless electronic device in accordance with a fifth embodiment of the invention.

The assembly of circuit boards 40 comprises a main PCB 4100, an additional printed circuit board 4200, separate to the main PCB 4100 and an antenna element 4300.

As in the previous embodiments, the main PCB 4100 is provided with electronic components for functional operations of the electronic device and a ground plane 4120. The additional PCB 4200 is provided with a wireless module including one or more electronic components for wireless operations of the electronic device and a feeding line 4220 connected to the wireless module. The additional circuit board 4200 is placed over and spaced apart from the main PCB 4100, and is disposed at an edge of the main PCB 4100. The additional PCB 4200 is provided with a plurality of ground pads 4335 printed on the additional PCB 4200 and corresponding fixing pillars 4230 extending from the respective ground pads towards the main PCB 4100 for connection to the ground plane 4120 of the main PCB 4100 providing grounding continuity between the main PCB 4100 and the additional PCB 4200.

Figure 5C:
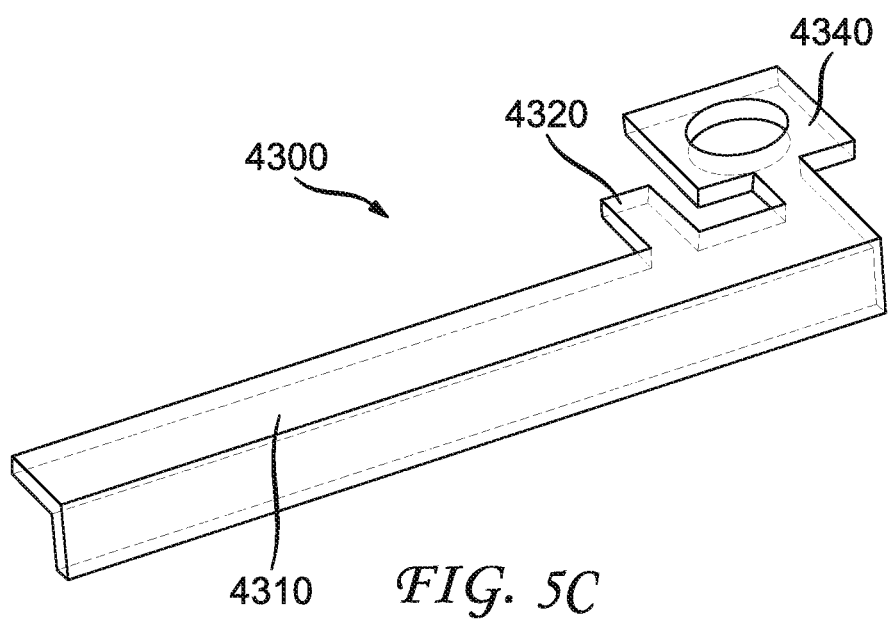
FIG. 5C is a perspective view of an antenna in accordance with the fifth embodiment of the invention.

With reference to FIG. 5C the antenna element 4300 is an inverted F type antenna and comprises a resonating part 4310, a feeding pin 4320 and a ground pin 4330; The feeding pin 4320 and the ground pin 4330 are disposed to extend from the resonating part 4310 towards the additional PCB 4200 and are orientated parallel to one another. The antenna element 4300 is arranged on the assembly of circuit boards such that the resonating part 4310 is disposed over the main PCB, extending parallel to the main PCB 4100 and along a side edge of the additional PCB 4200. The resonating part 4310 comprises a first planar resonating strip 4311 extending in a plane parallel to the main PCB 4100 and a second resonating strip 4312 extending in a plane perpendicular to the first resonating strip 4311 at the edge of the main PCB board 4100. The grounding pin 4330 is ended by a connector 4350 for connection to the ground pillar 4330 connecting the additional PCB 4200 to the grounding plane of the main board 4100. In one embodiment the connector is a square pad 4350 provided with a hole for receiving a fixing means such as a screw to connect the grounding pin to the ground pillar 4350. In this way a common grounding arrangement is provided for the antenna element 4300, the additional PCB 4200 and the main PCB 4100 providing grounding continuity. The feeding pin 4320 is connected to the feeding line 4220 of the additional PCB 4200.

Figure 6:
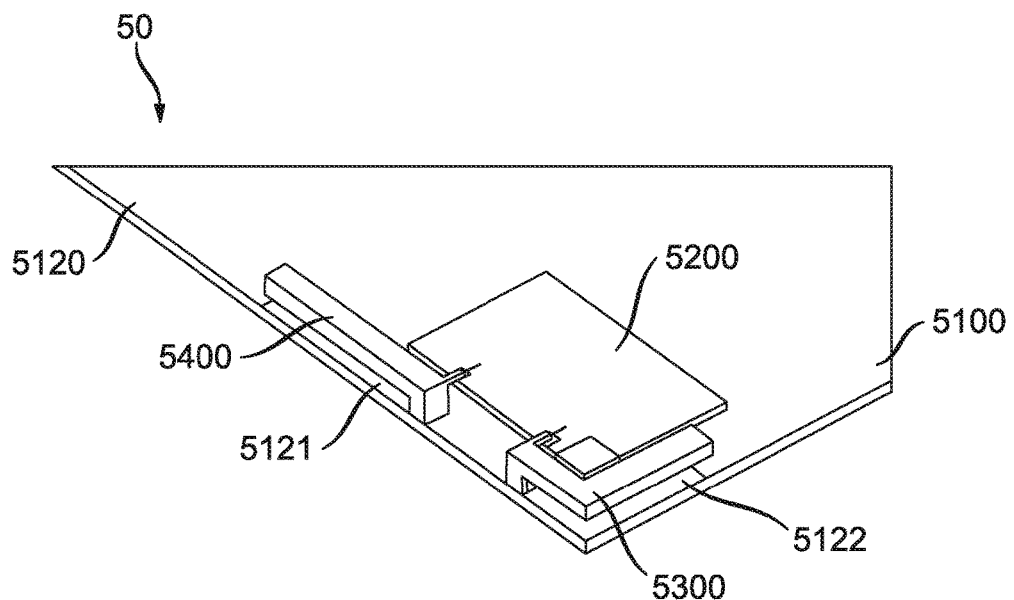
FIG. 6 is a perspective view of an assembly of circuit boards for a wireless electronic device having a plurality of antennae in accordance with a sixth embodiment of the invention.

FIG. 6 is a perspective view of an assembly of circuit boards for a wireless electronic device in accordance with a sixth embodiment of the invention. In this embodiment of the invention the circuit board assembly is provided with a plurality of antennas.

The assembly of circuit boards 50 comprises a main PCB 5100, an additional printed circuit board 5200, separate to the main PCB 5100 and two antenna elements 5300 and 5400.

As in the previous embodiments, the main PCB 5100 is provided with electronic components for functional operations of the electronic device and a ground plane 5120. The additional PCB 5200 is provided with a wireless module including one or more electronic components for wireless operations of the electronic device and a feeding line 5220 connected to the wireless module. The additional circuit board 5200 is placed over and spaced apart from the main PCB 5100, and is disposed at a corner region of the main PCB 5100. The additional PCB 5200 may be provided with a plurality of ground pads printed on the additional PCB 5200 and corresponding fixing pillars extending from the ground pad towards the main PCB 5100 for connection to the ground plane 5120 of the main PCB 5100.

The first antenna element 5300 is an inverted F type antenna identical to the antenna element 1300 in accordance with the first embodiment of the invention. The second antenna element 5400 is formed in an L shape and is similar to the antenna element 2300 in accordance with the second embodiment of the invention. The first antenna element is located at a corner of the additional PCB 5200, borders a part of an outer edge of the additional PCB 5200 and extends away from the additional PCB 5200 along the edge of the main PCB 5100. The second antenna element 5400 is located at a corner of the main PCB 5100 with its L shape bordering adjacent perpendicular edges of the additional PCB 5200. The main PCB 5100 is provided with two ground clearance areas 5121 and 5122 within the ground plane 5120 in registration respectively with the first 5300 and second antenna elements 5400.

A potential application for such a configuration comprising two antenna elements in 2*2 MIMO applications. An embodiment of the invention provides a wireless electronic device comprising the antenna assembly of FIG. 6. It will be appreciated that the invention is not limited to the provision of two antennas and any number of antenna elements may be included in the wireless electronic device, according to the targeted wireless application.

Figure 7:
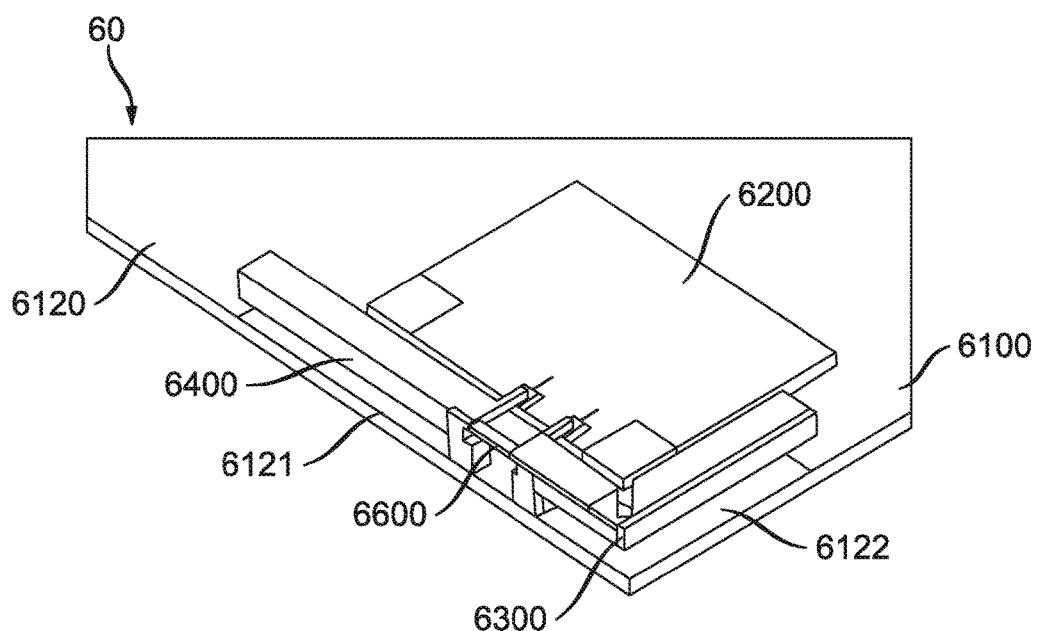
FIG. 7 is a perspective view of an assembly of circuit boards for a wireless electronic device having a plurality of antennae in accordance with a seventh embodiment of the invention.

FIG. 7 is a perspective view of an assembly of circuit boards for a wireless electronic device in accordance with a seventh embodiment of the invention. In this embodiment of the invention the circuit board assembly is provided with a plurality of antennas.

The assembly of circuit boards 60 comprises a main PCB 6100, an additional printed circuit board 6200, separate to the main PCB 6100 and an antenna system 6500 composed of two antenna elements 6300 and 6400 and a coupling line 6600 interconnecting antenna element 6300 and 6400. The coupling line may for example be a coupling line as described in Diallo, A., et al. (2006) Study and reduction of the mutual coupling between two mobile phone PIFAs operating in the DCS 1800 and UMTS bands. IEEE Trans. Antennas Propag., vol. 54, no. 11, November, pp. 3063-3073.

As in the previous embodiments, the main PCB 6100 is provided with electronic components for functional operations of the electronic device and a ground plane 6120. The additional PCB 6200 is provided with a wireless module including one or more electronic components for wireless operations of the electronic device and a feeding line 6220 connected to the wireless module. The additional circuit board 6200 is placed over and spaced apart from the main PCB 6100, and is disposed at a corner region of the main PCB 6100. The additional PCB 6200 may be provided with a plurality of ground pads printed on the additional PCB 6200 and corresponding fixing pillars extending from the ground pad towards the main PCB 6100 for connection to the ground plane 6120 of the main PCB 5100.

The first antenna element 5300 is an inverted F type antenna identical to the antenna element 1300 in accordance with the first embodiment of the invention. The second antenna element 5400 is formed in an L shape and is similar to the antenna element 2300 in accordance with the second embodiment of the invention. The first antenna element is located at a corner of the additional PCB 5200, borders a part of an outer edge of the additional PCB 5200 and extends away from the additional PCB 5200 along the edge of the main PCB 5100. The second antenna element 5400 is located at a corner of the main PCB 5100 with its L shape bordering adjacent perpendicular edges of the additional PCB 5200. The main PCB 6100 is provided with two clearance areas 6121 and 6122 within the ground planes 6120 in registration respectively with the first 5300 and second antenna elements 5400

A potential application for such a configuration comprising two antenna elements in 2*2 MIMO applications. An embodiment of the invention provides a wireless electronic device comprising the antenna assembly of FIG. 7.

Embodiments of the invention enable module to antenna interconnection insertion losses to be reduced. Moreover the space taken up on a main board of an electronic device can be reduced.

Although the present invention has been described hereinabove with reference to specific embodiments, the present invention is not limited to the specific embodiments, and modifications will be apparent to a skilled person in the art which lie within the scope of the present invention.

For instance, while the foregoing examples have been described with respect to a circuit board assembly comprising two boards it will be appreciated that the invention may be applied to a circuit board assembly comprising any number of circuit boards.

Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

The invention claimed is:

1. A circuit board assembly for an electronic device, comprising:
    a main circuit board provided with a ground plane and at least one electronic component for performing one or more functions of the electronic device;
    a wireless module board spaced apart from and over the main circuit board, the wireless module board being provided with a feed line and at least one wireless module for performing wireless operations; and
    an antenna element for wireless communication, the antenna element comprising a resonating element arranged over and spaced apart from the main board and extending alongside and external to at least part of an edge of the wireless module board, a first connection element connected to the feed line of the wireless module board and a second connection element connected to the main circuit board, wherein the first connection element is disposed perpendicularly to the second connection element, the first connection element and the second connection element being disposed perpendicularly to the resonating element of the antenna.

2. A circuit board assembly according to claim 1, wherein the second connection element is connected to the ground plane of the main circuit board.

3. A circuit board assembly according to claim 1, wherein the antenna element comprises an Inverted F type antenna.

4. A circuit board assembly according to claim 1, wherein the input impedance of the antenna is matched by adjustment of the width of parts composing the antenna element.

5. A circuit board assembly according to claim 1, wherein the first connection element extends from a side of the resonating element towards the wireless module board and the second connection element extends from the resonating element towards the main board.

6. A circuit board assembly according to claim 1, wherein the resonating element comprises a first part and a second part extending perpendicularly to the first part, the first and second part being arranged to border a corner of the wireless module board.

7. A circuit board assembly according to claim 1, wherein a ground clearance area is provided on the main board in registration with the resonating element.

8. A circuit board assembly according to claim 1, wherein the resonating element of the antenna is formed in an L shape, comprising a first part extending along a side of the wireless module board and a second part arranged to extend away from the main circuit board.

9. A circuit board assembly according to claim 1, wherein the second connection element is connected to the main board via a grounding connection of the wireless module board.

10. A circuit assembly according to claim 9 wherein the second connection element extends from the resonant element to the wireless module board and is arranged parallel to the first connection element.

11. A circuit board assembly according to claim 1 comprising a plurality of antenna elements.

12. A circuit board assembly according to claim 11 further comprising at least one coupling element for interconnecting two antenna elements.

13. A circuit board assembly according to claim 11 wherein a first antenna element of the plurality of antenna elements comprises a first part extending along a first side of the wireless module board and a second part extending perpendicularly to the first part, along a second adjacent side of the wireless module board and the second antenna element of the plurality of antenna elements comprises a first part extending along the first side of the wireless module board.

14. A wireless electronic device comprising a circuit board assembly in accordance with claim 1.

* * * * *